US012593600B2

(12) United States Patent
Lee et al.

(10) Patent No.: US 12,593,600 B2

(45) Date of Patent: Mar. 31, 2026

(54) DISPLAY DEVICE

(71) Applicant: SAMSUNG DISPLAY CO., LTD., Yongin-si (KR)

(72) Inventors: Jeongseok Lee, Yongin-si (KR); Seungyong Song, Suwon-si (KR); Hyekyun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 641 days.

(21) Appl. No.: 17/937,539

(22) Filed: Oct. 3, 2022

(65) Prior Publication Data

US 2023/0189554 A1 Jun. 15, 2023

(30) Foreign Application Priority Data

Dec. 14, 2021 (KR) ........................ 10-2021-0179128

(51) Int. Cl.
*H01L 51/52* (2006.01)
*H10K 59/35* (2023.01)
*H10K 59/80* (2023.01)

(52) U.S. Cl.
CPC ....... *H10K 59/8731* (2023.02); *H10K 59/353* (2023.02); *H10K 59/879* (2023.02); *H10K 59/352* (2023.02)

(58) Field of Classification Search
CPC ............. H10K 50/8445; H10K 50/858; H10K 59/353; H10K 59/352; H10K 59/8731; H10K 59/35; H10K 59/879; H10K 59/122; H10K 59/30
See application file for complete search history.

(56) References Cited

U.S. PATENT DOCUMENTS

| | | | |
|---|---|---|---|
| 9,614,168 | B2 | 4/2017 | Zhang et al. |
| 10,608,207 | B2 | 3/2020 | Ju et al. |
| 10,756,139 | B2 | 8/2020 | Kim et al. |
| 2022/0037592 | A1 | 2/2022 | Han et al. |

FOREIGN PATENT DOCUMENTS

| | | |
|---|---|---|
| KR | 10-2018-0031884 | 3/2018 |
| KR | 10-1943689 | 1/2019 |
| KR | 10-2020-0043951 | 4/2020 |
| KR | 10-2021-0107366 A | 9/2021 |

*Primary Examiner* — Elmito Breval

(74) *Attorney, Agent, or Firm* — F. CHAU & ASSOCIATES, LLC

(57) ABSTRACT

A display device includes a light-emitting element layer and an encapsulation layer disposed on the light-emitting element layer. The encapsulation layer includes a first inorganic film having a first refractive index at a wavelength between about 380 nm and about 500 nm, the first refractive index being between about 1.5 and about 1.7, a second inorganic film disposed on the first inorganic film and having a second refractive index at a wavelength between about 380 nm and about 500 nm, the second refractive index being between about 1.5 and about 1.7, and an organic film disposed between the first inorganic film and the second inorganic film, and having a third refractive index at a wavelength between about 380 nm and about 500 nm, the third refractive index being between about 1.5 and about 1.7. Accordingly, the display device including the encapsulation layer with the high light transmittance may have the high light emission efficiency.

20 Claims, 9 Drawing Sheets

DISPLAY DEVICE

CROSS-REFERENCE TO RELATED APPLICATIONS

This U.S. non-provisional patent application claims priority under 35 U.S.C. § 119 of Korean Patent Application No. 10-2021-0179128, filed on Dec. 14, 2021, the entire contents of which are hereby incorporated by reference.

BACKGROUND

The present disclosure relates to a display device, and more particularly, to a display device including an encapsulation layer having high transmittance.

In order to provide image information, various types of display devices have been used, and a self-luminous display device using an organic electroluminescence material, a quantum dot light-emitting material or the like, has been developed.

The self-luminous display device includes a light-emitting element. The light-emitting element has vulnerability to an external environment such as oxygen and moisture, and thus, sealing is desirable for the light-emitting element. An encapsulation layer has been developed for blocking a penetration path of oxygen, moisture and so on by disposing the encapsulation layer on the light-emitting element. The encapsulation layer may have a structure in which an inorganic film containing an inorganic material, and an organic film containing an organic material, are alternately laminated.

The encapsulation layer capable of sealing the light-emitting element and having the high light transmittance has been developed.

SUMMARY

The present disclosure provides a display device including an encapsulation layer with the light transmittance improved by including organic and inorganic films, of which a refractive index difference therebetween is small.

The present disclosure also provides a display device with the light emission efficiency improved by including an encapsulation layer with the improved light transmittance.

An embodiment of the inventive concept provides a display device for including a light-emitting element layer; and an encapsulation layer disposed on the light-emitting element layer. The encapsulation layer includes a first inorganic film having a first refractive index at a wavelength between about 380 nm and about 500 nm, the first refractive index being between about 1.5 and about 1.7; a second inorganic film disposed on the first inorganic film and having a second refractive index at a wavelength between about 380 nm and about 500 nm, the second refractive index being between about 1.5 and about 1.7; and an organic film disposed between the first inorganic film and the second inorganic film, and having a third refractive index at a wavelength between about 380 nm and about 500 nm, the third refractive index being between about 1.5 and about 1.7.

In an embodiment, an absolute value of a difference between the second refractive index and the third refractive index may be about 0.1 or less, and an absolute value of a difference between the first refractive index and the third refractive index may be about 0.1 or less.

In an embodiment, the organic film may include an epoxy-based copolymer including, as a substituent, at least one of a hydroxy ketone group, a carboxyl group, a thioether group, a sulfone group, a cyclic thiophene group, a thiadiazole group, and a thianthrene group.

In an embodiment, the first inorganic film may have a thickness between about 0.8 μm and about 1.2 μm, the second inorganic film may have a thickness between about 0.5 μm and about 0.7 μm, and the organic film may have a thickness between about 4.0 μm and about 8.0 μm.

In an embodiment, the encapsulation layer may have a transmittance between about 85% and about 95% with respect to light having a wavelength between about 380 nm and about 500 nm.

In an embodiment, each of the first inorganic film, the second inorganic film and the organic film may have a refractive index at a wavelength between about 380 nm and about 500 nm that is higher than a refractive index at a wavelength between about 500 nm and about 780 nm.

In an embodiment, the light-emitting element layer may include a pixel defining film exposing each of first to third light-emitting elements. The first light-emitting element may emit red light, the second light-emitting element may emit green light, and the third light-emitting element may emit blue light.

In an embodiment of the inventive concept, a display device includes a base layer, a light-emitting element layer disposed on the base layer, an encapsulation layer disposed on the light-emitting element layer and including at least one inorganic film and at least one organic film that are alternately laminated. The at least one inorganic film includes an epoxy-based copolymer including at least one substituent among a hydroxy ketone group, a carboxyl group, a thioether group, a sulfone group, a cyclic thiophene group, a thiadiazole group, and a thianthrene group. The at least one organic film has a refractive index between about 1.5 and about 1.7 at a wavelength between about 380 nm and about 500 nm.

In an embodiment, the encapsulation layer may have an average transmittance between about 85% and about 95% with respect to light having a wavelength between about 380 nm and about 500 nm.

In an embodiment, an absolute value of a refractive index difference between the at least one organic film and the at least one inorganic film that are adjacent to each other, may be about 0.1 or less.

In an embodiment, the at least one inorganic film may include at least one of $SiN_x$, $SiO_x$, $SiO_xN_y$, SiC, $ZrO_x$, and $Al_2O_3$.

In an embodiment, the at least one inorganic film may have a thickness smaller than a thickness of the at least one organic film.

In an embodiment, the at least one organic film may have a thickness between about 4.0 μm and about 8.0 μm.

In an embodiment, the light-emitting element layer may include a pixel defining film exposing each of first to third light-emitting elements. The first light-emitting element may emit red light, the second light-emitting element may emit green light, and the third light-emitting element may emit blue light.

In an embodiment of the inventive concept, a display device is divided into a first emission area, a second emission area and a third emission area, and includes a base layer; a light-emitting element layer disposed on the base layer, and including first to third light-emitting elements respectively corresponding to the first to third emission areas; and an encapsulation layer disposed on the light-emitting element layer, and including a first inorganic film, a second inorganic film, and an organic film between the first inorganic film and the second inorganic film. The first light-emitting element emits red light, the second light-emitting element emits green light, and the third light-emitting element emits blue light. A planar area of the third emission area is greater than a planar area of each of the first emission area and the second emission area. A first refractive index of the first inorganic film with respect to the blue light is between about 1.5 and about 1.7. A second refractive index of the organic film with respect to the blue light is between about 1.5 and about 1.7. A third refractive index of the second inorganic film with respect to the blue light is between about 1.5 and about 1.7.

In an embodiment, the encapsulation layer may have an average transmittance between about 85% and about 95% with respect to the blue light.

In an embodiment, an absolute value of a difference between the first refractive index and the third refractive index may be about 0.1 or less, and an absolute value of a difference between the second refractive index and the third refractive index may be about 0.1 or less.

In an embodiment, the organic film may include an epoxy-based copolymer including, as a substituent, at least one of a hydroxy ketone group, a carboxyl group, a thioether group, a sulfone group, a cyclic thiophene group, a thiadiazole group, and a thianthrene group.

In an embodiment, each of the first inorganic film, the second inorganic film and the organic film may have a refractive index at a wavelength between about 380 nm and about 500 nm that is higher than a refractive index at a wavelength between about 500 nm and about 780 nm.

In an embodiment, the second emission area may be smaller than the third emission area.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
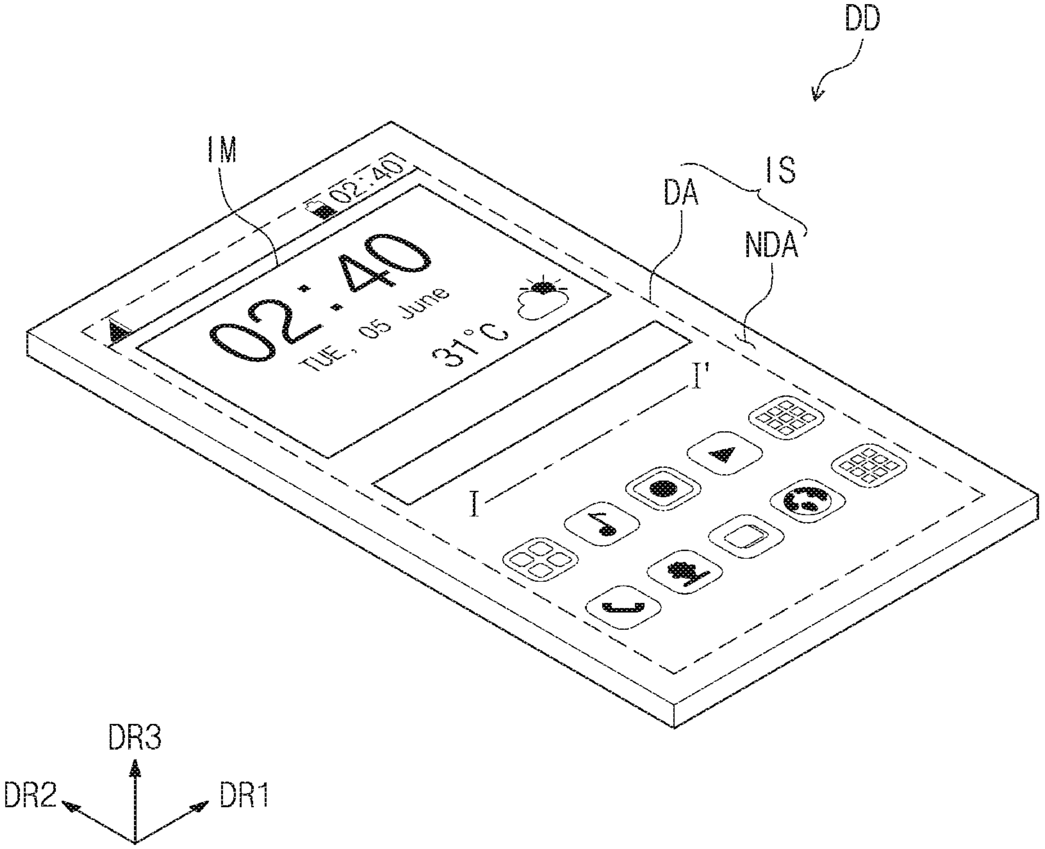
FIG. 1 is a perspective view of a display device according to an embodiment.

Embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will be understood that when an element (or region, layer, section, etc.) is referred to as being "on", "connected to" or "coupled to" another element, it can be disposed directly on, connected or coupled to the other element or an intervening element may be disposed between the elements.

In the present disclosure, the phrase "being disposed directly on" may mean that there is no additional layer, film, region, substrate or the like between a part such as a layer, film, region or substrate, and another part. For example, the phrase "being disposed directly on" may mean that two layers or two members are disposed with no additional member such as an adhesive member, used therebetween.

Like reference numbers or symbols refer to like elements throughout. In addition, in the drawings, the thickness, the ratio, and the dimension of elements are exaggerated for effective description of the technical contents.

The term "and/or" includes one or more combinations which may be defined by relevant elements.

It will be understood that, although the terms first, second, etc. may be used herein to describe various elements, these elements should not be limited by these terms. These terms are only used to distinguish one element from another element. For example, a first element could be termed a second element without departing from the teachings of the present invention, and similarly, a second element could be termed a first element. As used herein, the singular forms are intended to include the plural forms as well, unless the context clearly indicates otherwise.

In addition, the terms, such as "below", "beneath", "on" and "above", are used for explaining the relation of elements shown in the drawings. The terms are relative concept and are explained based on the direction shown in the drawing. Thus, the exemplary term "above" can encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms such as "includes" or "has", when used herein, specify the presence of stated features, numerals, steps, operations, elements, parts, or the combination thereof, but do not preclude the presence or addition of one or more other features, numerals, steps, operations, elements, parts, or the combination thereof.

Hereinafter, embodiments of the inventive concept will be described in detail with reference to the accompanying drawings.

Figure 2:
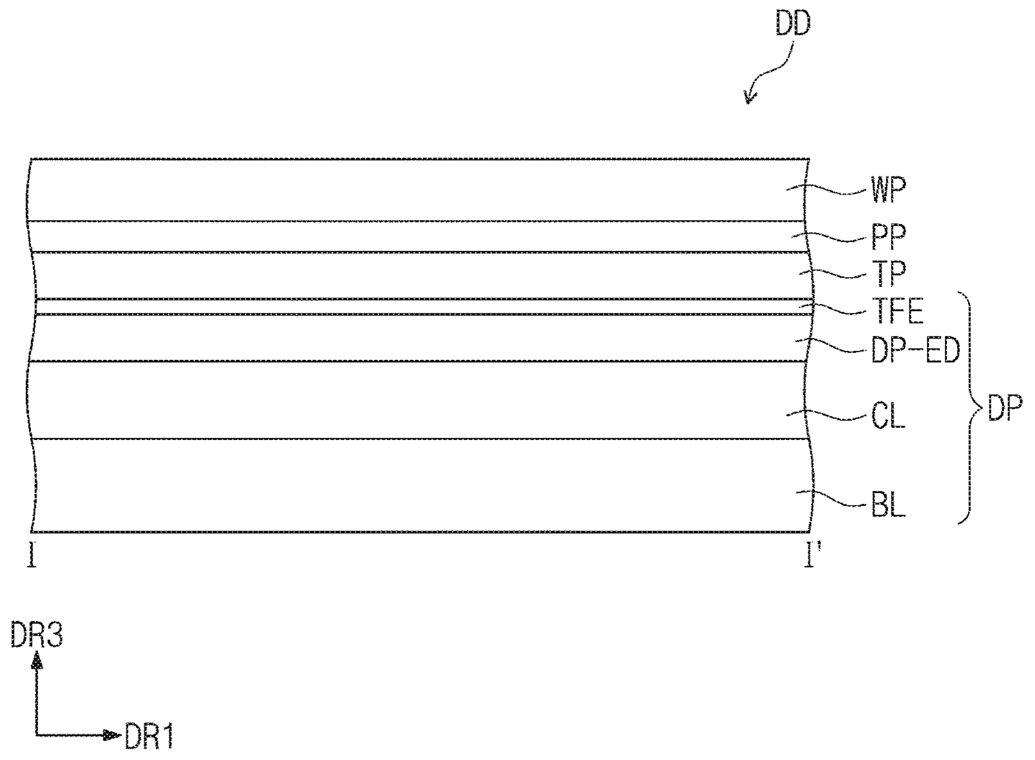
FIG. 2 is a cross-sectional view of the display device of FIG. 1 according to an embodiment.
Figure 3:
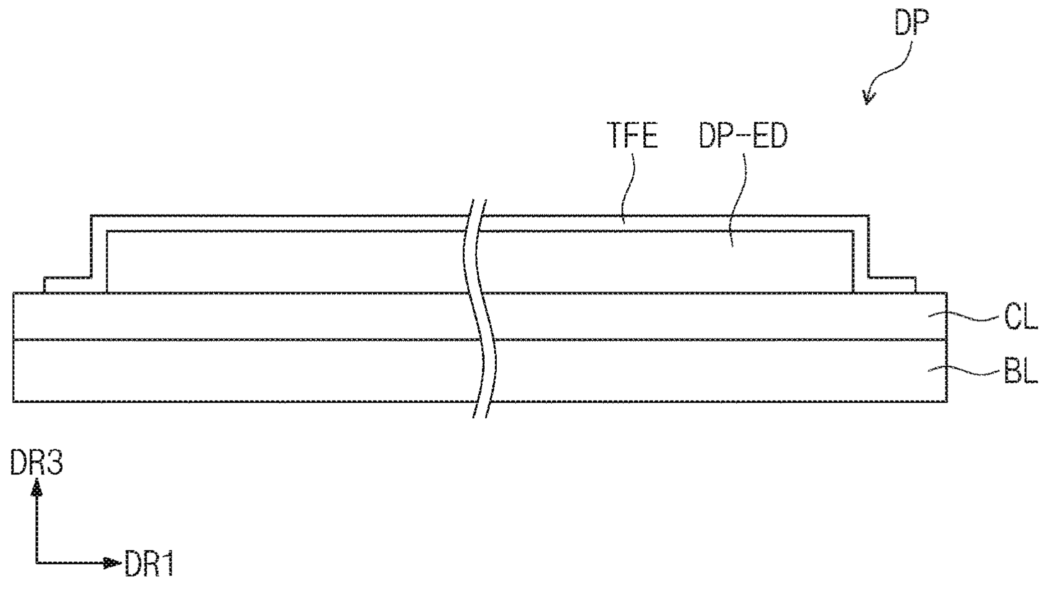
FIG. 3 is a cross-sectional view of a display panel according to an embodiment.

FIG. 1 is a perspective view of a display device according to an embodiment, and FIG. 2 is a cross-sectional view of the display device according to an embodiment. FIG. 2 is a cross-sectional view illustrating a portion corresponding to line I-I' in FIG. 1. FIG. 3 is a cross-sectional view of a display panel according to an embodiment.

Referring to FIG. 1, a display device DD may display an image IM through a display surface IS. FIG. 1 illustrates that the display surface IS is parallel with a surface defined by a first direction axis DR1 and a second direction axis DR2 crossing the first direction axis DR1. However, this is merely an example, and a display surface of a display device according to an embodiment may have a curved shape.

A third direction axis DR3 indicates a normal direction of the display surface IS, i.e., a thickness direction of the display device DD. A front surface (or upper surface) and a rear surface (or lower surface) of each member are defined by the third direction axis DR3. However, the directions indicated by the first to third direction axes DR1, DR2 and DR3 are relative concept and may be changed to other directions. Hereinafter, first to third directions are directions respectively indicated by the first to third direction axes DR1, DR2 and DR3 and are referred to by the same reference numbers or symbols.

FIG. 1 illustrates a portable electronic device as an example of the display device DD. However, the display device DD may be used in large-sized electronic devices such as a television, a monitor or an outdoor billboard, and in small and medium-sized electronic devices such as a personal computer, a notebook computer, a personal digital assistant, a vehicle navigation unit, a game console, a smartphone, a tablet computer and a camera. In addition, these are just suggested as embodiments, and the display device DD may be employed also in another electronic device without departing from the inventive concept.

The display surface IS includes a display area DA on which an image IM is displayed, and a non-display area NDA adjacent to the display area DA. The non-display area NDA is an area on which the image IM is not displayed. FIG. 1 illustrates a clock window and application icons as an example of the image IM.

The display area DA may have a rectangular shape. The non-display area NDA may surround the display area DA. However, an embodiment of the inventive concept is not limited thereto, and the shape of the display area DA and the shape of the non-display area NDA may be relatively designed. In addition, the non-display area NDA may not be present on a front surface of the display device DD.

The display device DD according to an embodiment may include a light-emitting element layer (i.e., a light-emitting layer) DP-ED, and an encapsulation layer TFE disposed on the light-emitting element layer DP-ED. The encapsulation layer TFE may cover the light-emitting element layer DP-ED. The encapsulation layer TFE will be described in detail later.

The display device DD according to an embodiment may further include an input sensing part TP disposed on a display panel DP, and a polarizing member PP disposed on the input sensing part TP. In an embodiment, the input sensing part TP may be disposed on the encapsulation layer TFE. In an embodiment, the input sensing part TP may be disposed directly on the encapsulation layer TFE. For example, the encapsulation layer TFE may contact the input sensing part TP.

The input sensing part TP may recognize a direct touch of a user, an indirect touch of the user, a direct touch of an object, or an indirect touch of the object. The input sensing part TP may detect a position of a touch applied from the outside, and an intensity (pressure) of the touch. The input sensing part TP according to an embodiment of the inventive concept may have various structures or may be made of various materials, and is not limited to any one embodiment. For example, the input sensing part TP in the display device DD according to an embodiment may be a touch sensing unit that detects a touch.

The polarizing member PP may block external light provided to the display panel DP from the outside. The polarizing member PP may block a portion of the external light. For example, the polarizing member PP may block light having a wavelength of about 380 nm or less. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In an embodiment, the polarizing member PP may reduce reflective light generated by external light in the display panel DP. For example, the polarizing member PP may function to block reflective light when the light provided from the outside of the display device DD is incident on the display panel DP and is reflected therefrom. The polarizing member PP may be a circular polarizer having an anti-reflective function, or the polarizing member PP may include a linear polarizer and a $\lambda/4$ phase retarder.

The display device DD according to an embodiment may further include a window member WP. The window member WP may define a front surface of the display device DD. The window member WP may protect internal components of the display device DD from an external impact. The window member WP may include or may be a glass substrate or may include or may be a plastic substrate.

FIG. 2 illustrates that the display device DD includes the input sensing part TP, the polarizing member PP, and the window member WP, but an embodiment is not limited thereto. At least one of the polarizing member PP, the input sensing part TP, or the window member WP may be omitted in the display device DD according to an embodiment.

Figure 4:
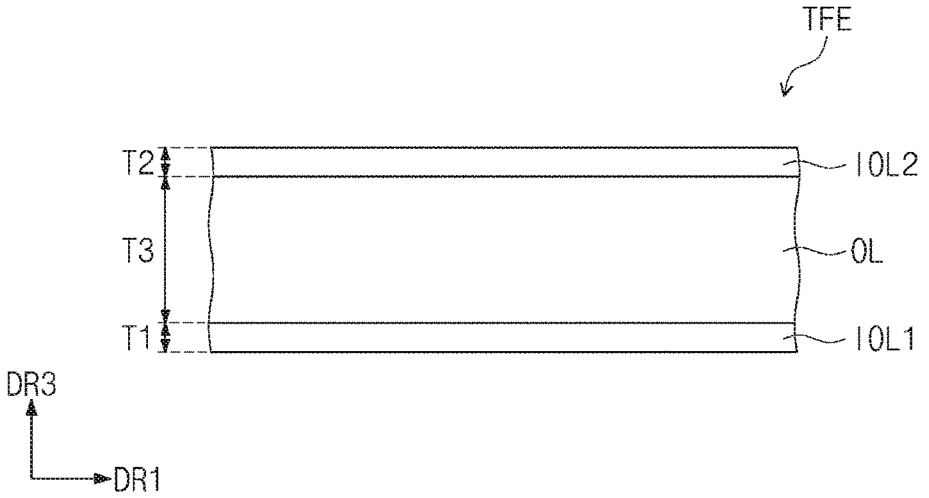
FIG. 4 is a cross-sectional view illustrating a portion of an encapsulation layer according to an embodiment.

FIG. 4 is a cross-sectional view illustrating a portion of the encapsulation layer according to an embodiment.

Referring to FIG. 4, two inorganic films IOL1 and IOL2, and an organic film OL disposed between the inorganic films IOL1 and IOL2, may be provided. In the encapsulation layer TFE according to an embodiment, a first inorganic film IOL1 may have a first refractive index at a wavelength between about 380 nm and about 500 nm, a second inorganic film IOL2 may have a second refractive index at a wavelength between about 380 nm and about 500 nm, and the organic film OL may have a third refractive index at a wavelength between about 380 nm and about 500 nm.

In the encapsulation layer TFE according to an embodiment, an absolute value of a difference between the second refractive index and the third refractive index may be about 0.1 or less, and an absolute value of a difference between the first refractive index and the third refractive index may be about 0.1 or less. The absolute value of the difference between the second refractive index and the third refractive index may be adjusted to be about 0.1 or less, and the absolute value of the difference between the first refractive index and the third refractive index, may be adjusted to be about 0.1 or less. At an interfacial surface between the first inorganic film IOL1 and the organic film OL, and at an interfacial surface between the organic film OL and the second inorganic film IOL2 in the encapsulation layer TFE, light reflectance may be reduced according to an embodiment. Accordingly, the encapsulation layer TFE according to an embodiment may have a transmittance between about 85% and about 95% with respect to light having a wavelength between about 380 nm and about 500 nm.

Each of the first to third refractive indices may be independently between about 1.5 and about 1.7. For example, the first refractive index may be between about 1.5 and about 1.7, the second refractive index may be between about 1.5 and about 1.7, and the third refractive index may be between about 1.5 and about 1.7. In an embodiment, the first to third refractive indices may be different from each other. In an embodiment, at least two refractive indices among the first to third refractive indices may have the same value.

When compared to a typical encapsulation layer, the encapsulation layer TFE according to an embodiment may have a high refractive index at a wavelength between about 380 nm and about 500 nm in the organic film OL. The organic film OL according to an embodiment may include or may be formed of a copolymer containing, as a substituent, at least one of a hydroxy ketone group, a carboxyl group, a thioether group, a sulfone group, a cyclic thiophene group, a thiadiazole group, and a thianthrene group. A substituent substituted in the copolymer according to an embodiment may increase the refractive index at a wavelength between about 380 nm and about 500 nm in the organic film OL. For example, the copolymer may be an acrylic copolymer, methacryl-based copolymer, polyisoprene, vinyl-based copolymer, epoxy-based copolymer, urethane-based copolymer, cellulose-based copolymer, siloxane-based copolymer, polyimide-based copolymer, polyamide-based copolymer, or perylene-based copolymer. In an embodiment, the copolymer according to an embodiment may include or may be an epoxy-based copolymer.

When compared to a typical encapsulation layer, the encapsulation layer TFE according to an embodiment may have a small refractive index at a wavelength between about 380 nm and about 500 nm in each of the first inorganic film IOL1 and the second inorganic film IOL2.

In an embodiment, the refractive index of an inorganic film only among in the encapsulation layer is adjusted in order to achieve an encapsulation layer having a transmittance between about 85% and about 95% with respect to light having a wavelength between about 380 nm and about 500 nm. In this case, however, the barrier property of the encapsulation layer is not maintained. The encapsulation layer TFE according to an embodiment increases the refractive index of the organic film OL, thereby decreasing the refractive index difference between the organic film OL and each of the inorganic films IOL1 and IOL2. Accordingly, with the barrier property maintained, the encapsulation layer TFE according to an embodiment may have a transmittance between about 85% and about 95% with respect to light having a wavelength between about 380 nm and about 500 nm.

In an embodiment, the first inorganic film IOL1, the second inorganic film IOL2 and the organic film OL may each have a refractive index at a wavelength between about 380 nm and about 500 nm that is higher than a refractive index at a wavelength between about 500 nm and about 780 nm.

A thickness T3 of the organic film OL may be greater than each of a thickness T1 of the first inorganic film IOL1 and a thickness T2 of the second inorganic film IOL2. For example, the thickness T1 of the first inorganic film IOL1 may be between about 0.8 μm and about 1.2 μm, the thickness T2 of the second inorganic film may be between about 0.5 μm and about 1.7 μm, and the thickness T3 of the organic film OL may be between about 4.0 μm and about 8.0 μm. However, this is merely an example, and an embodiment is not limited thereto.

In an embodiment, the inorganic film IOL1 and IOL2 may include or may be formed of at least one of silicon nitride ($SiN_x$), silicon oxide ($SiO_x$), silicon oxynitride ($SiO_xN_y$), silicon carbide (SiC), zirconium oxide ($ZrO_x$), and aluminium oxide ($Al_2O_3$). Here, x and y may be each independently greater than 0 and less than 4, and x and y are not limited to an integer. For example, x may be between 0 and 4, and y may be between 0 and 4.

The inorganic film IOL1 and IOL2 may be formed by using a method such as sputtering, chemical vapor deposition (CVD), plasma enhanced chemical vapor deposition (PECVD), and atomic layer deposition, but an embodiment of the inventive concept is not limited thereto.

Figure 5:
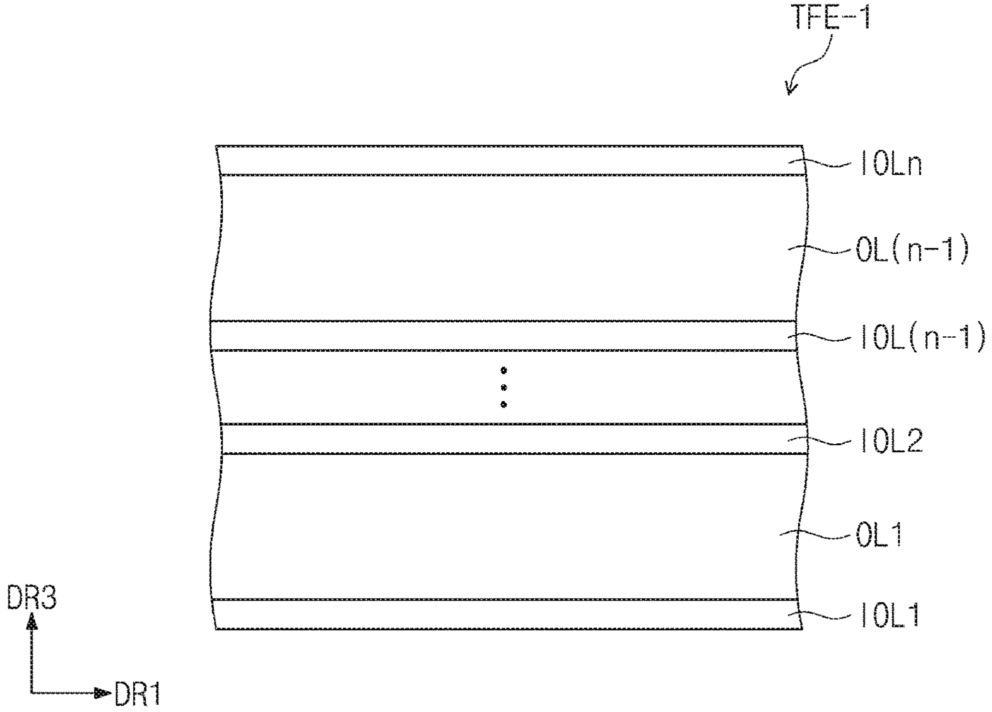
FIG. 5 is a cross-sectional view illustrating a portion of an encapsulation layer according to an embodiment.

FIG. 5 is a cross-sectional view illustrating a portion of an encapsulation layer according to an embodiment.

Referring to FIG. 5, an encapsulation layer TFE-1 may include at least one organic film OL1 to OL(n−1) and at least one inorganic film IOL1 to IOLn, and the at least one inorganic film IOL1 to IOLn and organic film OL may be alternately disposed. The encapsulation layer TFE-1 according to an embodiment may include n inorganic films IOL1 to IOLn including a first inorganic film IOL1 disposed on the light-emitting element layer DP-ED (see FIG. 3). In addition, the first inorganic film IOL1 may be disposed directly on the light-emitting element layer DP-ED (see FIG. 3). The first inorganic film IOL1 may be defined as a lower inorganic film and, the inorganic films excluding the first inorganic film IOL1 may be defined as upper inorganic films.

The encapsulation layer TFE-1 may include n−1 organic films OL1 to OL(n−1), and the n−1 organic films OL1 to OL(n−1) may be disposed alternately with the n inorganic films IOL1 to IOLn. The n−1 organic films OL1 to OL(n−1) may have a thickness greater than a thickness of the n inorganic films IOL1 to IOLn on average. For example, an average thickness of the combined thicknesses of the n−1 organic films OL1 to OL(n−1) divided by the number of films in the n−1 organic films OL1 to OL(n−1) may be greater than an average thickness of the combined thickness of the n inorganic films IOL1 to IOLn divided by the number of films in the n inorganic films IOL1 to IOLn. In an embodiment, each of the n−1 organic films OL1 to OL(n−1) may have a thickness greater than a thickness of each of the n inorganic film IOL1 to IOLn.

An absolute value of a difference between a refractive index at a wavelength between about 380 nm and about 500 nm in the n inorganic films IOL1 to IOLn, and a refractive index at a wavelength between about 380 nm and about 500 nm in the n−1 organic films OL1 to OL(n−1), may each be about 0.1 or less. For example, an absolute value of a difference between refractive indices, at a wavelength between about 380 nm and about 500 nm, of two adjacent organic and inorganic films among the n−1 organic films OL1 to OL(n−1) and the n inorganic films IOL1 to IOLn. Each of the n inorganic films IOL1 to IOLn may independently have a refractive index between about 1.5 and about 1.7 at a wavelength between about 380 nm and about 500 nm. Each of the n−1 organic films OL1 to OL(n−1) may independently have a refractive index between about 1.5 and about 1.7 at a wavelength between about 380 nm and about 500 nm.

Since the absolute value of the difference between the refractive index at a wavelength between about 380 nm and about 500 nm in the n inorganic films IOL1 to IOLn, and the refractive index at a wavelength between about 380 nm and about 500 nm in the n−1 organic films OL1 to OL(n−1), are each about 0.1 or less, the light reflectance may be reduced on an interfacial surface between the n inorganic films IOL1 to IOLn and the n−1 organic films OL1 to OL(n−1) adjacent to each other. Accordingly, the encapsulation layer TFE-1 including the alternately disposed n inorganic films IOL1 to IOLn and n−1 organic films OL1 to OL(n−1) may have a high transmittance with respect to light having a wavelength between about 380 nm and about 500 nm. For example, the encapsulation layer TFE-1 according to an embodiment may have a transmittance between about 85% and about 95% with respect to light having a wavelength between about 380 nm and about 500 nm.

The n inorganic films IOL1 to IOLn and the n−1 organic films OL1 to OL(n−1) may each have a refractive index at a wavelength between about 380 nm and about 500 nm that is higher than a refractive index at a wavelength between about 500 nm and about 780 nm.

Figure 6:
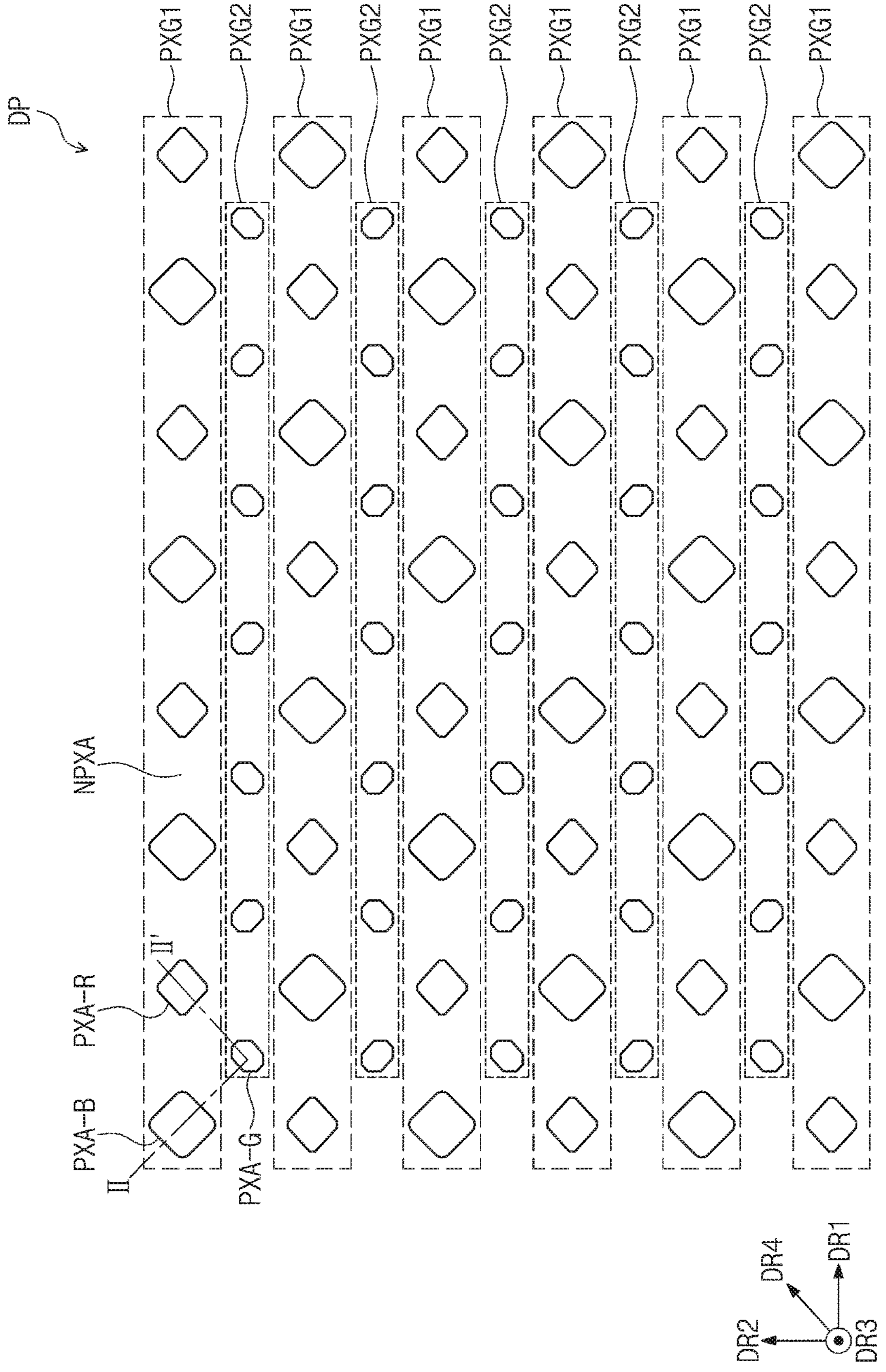
FIG. 6 is a plan view of a display panel according to an embodiment.
Figure 7:
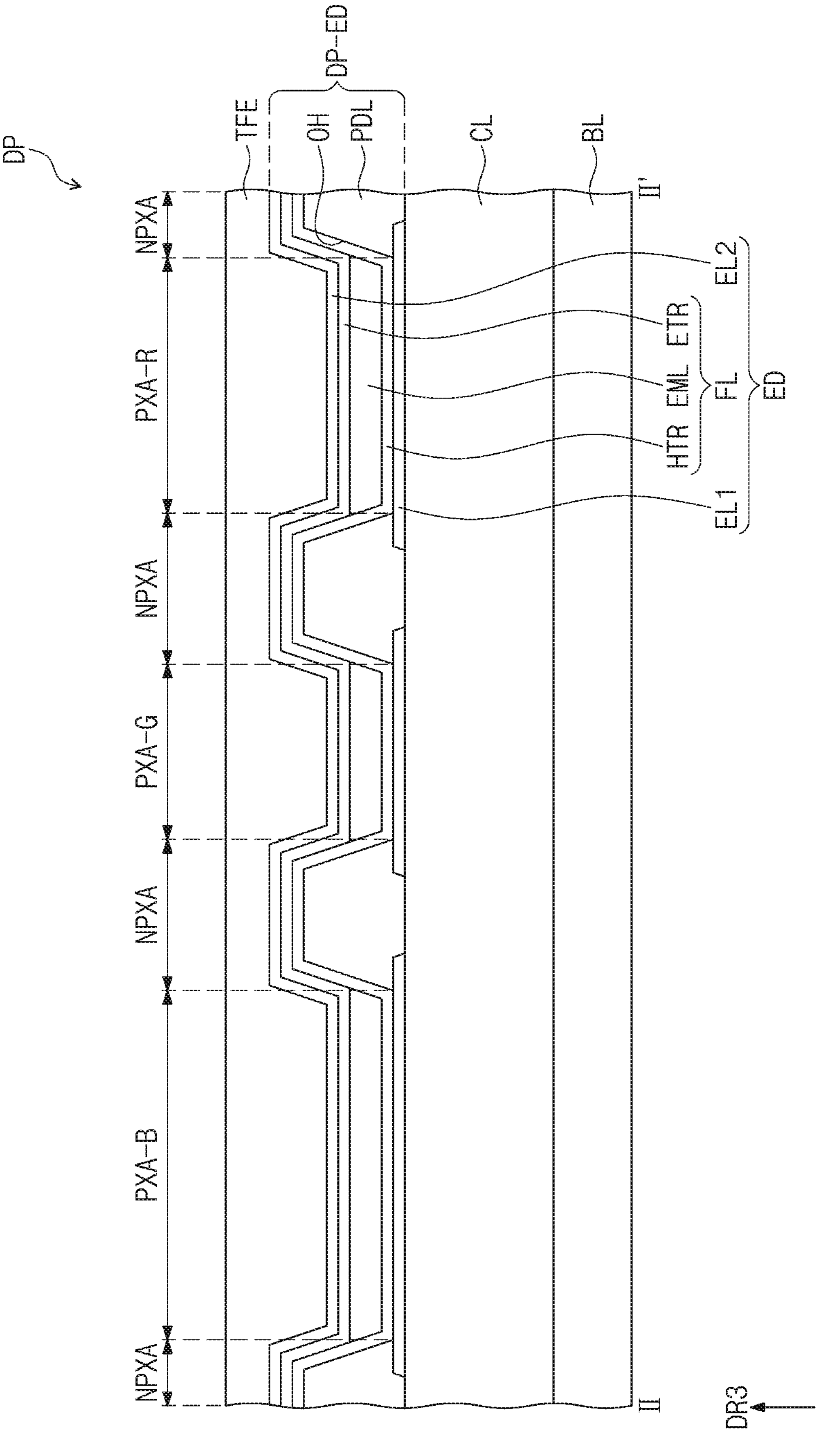
FIG. 7 is a cross-sectional view of the display panel.

FIG. 6 is a plan view of a display panel according to an embodiment. FIG. 7 is a cross-sectional view of the display panel. FIG. 7 is a cross-sectional view illustrating a portion corresponding to line II-II' in FIG. 6.

Referring to FIGS. 6 and 7, a display panel DP may include a non-emission area NPXA and emission areas PXA-R, PXA-G and PXA-B. The emission areas PXA-R, PXA-G and PXA-B may each be an area from which light generated in a light-emitting element ED is emitted. The respective areas of the emission areas PXA-R, PXA-G and PXA-B may be different from each other. Here, the area may mean an area as seen on a plane.

The emission areas PXA-R, PXA-G and PXA-B may be divided into several groups depending on colors of light generated in the light-emitting element ED. In the display panel DP according to an embodiment illustrated in FIGS. 6 and 7, three emission areas PXA-R, PXA-G and PXA-B that respectively emit red light, green light and blue light are illustrated as an example.

The emission areas PXA-R, PXA-G and PXA-B may have different areas depending on colors of light emitted from a light-emitting layer EML of the light-emitting element ED. For example, referring to FIG. 6, in the display panel DP according to an embodiment, a blue emission area PXA-B of a light-emitting element that emits blue light may have a largest area, and a green emission area PXA-G of a light-emitting element that generates green light may have a smallest area. When in a display device DD according to an embodiment, the blue emission area PXA-B has a largest area, the light emission efficiency of the entirety of the display device DD may be determined by the blue light emission efficiency. That is, the display device DD according to an embodiment may include the encapsulation layer TFE (see FIG. 4) with the improved transmittance with respect to blue light, thereby improving the blue light emission efficiency of the display device DD and accordingly improving the light emission efficiency of the entirety of the display device DD.

However, an embodiment is not limited thereto. The emission areas PXA-R, PXA-G and PXA-B may emit light having a color other than red, green and blue colors. The emission areas PXA-R, PXA-G and PXA-B may have the same area as each other, or the emission areas PXA-R, PXA-G and PXA-B may be provided at an area ratio different from the illustration in FIG. 6.

The emission areas PXA-R, PXA-G and PXA-B may each be defined by a pixel defining film PDL. The non-emission areas NPXA each is an area between the neighboring emission areas PXA-R, PXA-G and PXA-B and corresponding to the pixel defining film PDL. In the present disclosure, the emission areas PXA-R, PXA-G and PXA-B may each correspond to a pixel.

The pixel defining film PDL may include or may be formed of a polymer resin. For example, the pixel defining film PDL may include or may be formed of a polyacrylate-based resin or a polyimide-based resin. The pixel defining film PDL may further include an inorganic material in addition to the polymer resin. The pixel defining film PDL may include a light absorbing material, or may include a black pigment or a black dye. The pixel defining film PDL including the black pigment or the black dye may be a black pixel defining film. When the pixel defining film PDL is formed, a carbon black, etc. may be used as the black pigment or the black dye, but an embodiment is not limited thereto.

In addition, the pixel defining film PDL may be formed of an inorganic material. For example, the pixel defining film PDL may include or may be formed of silicon nitride ($SiN_x$), silicon oxide ($SiO_x$), or silicon oxynitride ($SiO_xN_y$). The pixel defining film PDL may define the emission areas PXA-R, PXA-G and PXA-B. The emission areas PXA-R, PXA-G and PXA-B and the non-emission area NPXA may be divided by the pixel defining film PDL.

The blue emission areas PXA-B and red emission areas PXA-R may be alternately arranged along the first direction axis DR1 and constitute a first group PXG1. The green emission areas PXA-G may be arranged along the first direction axis DR1 and constitute a second group PXG2.

The first group PXG1 and the second group PXG2 may be spaced apart from each other in a second direction axis DR2 direction. The first group PXG1 and the second group PXG2 may each be provided in plurality. The first groups PXG1 and the second groups PXG2 may be alternately arranged along the second direction axis DR2.

A single green emission area PXA-G may be spaced apart in a fourth direction axis DR4 direction from a single blue emission area PXA-B or a single red emission area PXA-R. The fourth direction axis DR4 direction may be a direction between the first direction axis DR1 direction and the second direction axis DR2 direction. The first direction axis DR1 direction, the second direction axis DR2 direction, and the fourth direction axis DR4 direction are on the same plane.

An arrangement structure of the emission areas PXA-R, PXA-G and PXA-B illustrated in FIG. 6 may be called PenTile® structure. However, an arrangement structure of the emission areas PXA-R, PXA-G and PXA-B in the display panel DP according to an embodiment is not limited to the arrangement structure illustrated in FIG. 6. For example, in an embodiment, the emission areas PXA-R, PXA-G and PXA-B may have a stripe structure in which the red emission area PXA-R, the green emission area PXA-G and the blue emission area PXA-B are arranged alternately in sequence along the first direction axis DR1.

The display panel DP according to an embodiment may be a light-emitting display panel. For example, the display panel DP may be an organic electroluminescence display panel or a quantum dot light-emitting display panel. However, an embodiment is not limited thereto.

When the display panel DP is an organic electroluminescence display panel, a light-emitting element layer DP-ED may include an organic electroluminescence element. In addition, when the display panel DP is a quantum dot light-emitting display panel, the light-emitting element layer DP-ED may include a quantum dot light-emitting layer.

In an embodiment, the light-emitting element ED may include a first electrode EL1 and a second electrode EL2 facing each other, and a plurality of functional layers FL disposed between the first electrode EL1 and the second electrode EL2. The functional layers FL may include a hole transport region HTR, a light-emitting layer EML and an electron transport region ETR.

The light-emitting element ED may include a first electrode EL1, a hole transport region HTR disposed on the first electrode EL1, a light-emitting layer EML disposed on the hole transport region HTR, an electron transport region ETR disposed on the light-emitting layer EML, and a second electrode EL2 disposed on the electron transport region ETR. The hole transport region HTR may include a hole injection layer HIL and a hole transport layer HTL, and the electron transport region ETR may include an electron injection layer EIL and an electron transport layer ETL. In an embodiment, the hole transport region HTR may include one of the hole injection layer HIL and the hole transport layer HTL, and the electron transport region ETR may include one of the electron injection layer EIL and the electron transport layer ETL. A known hole transport material and a known electron transport material may be used in the hole transport region HTR and the electron transport region ETR, respectively.

The hole transport region HTR is disposed on the first electrode EL1 in an opening OH defined in the pixel defining film PDL, and may extend to an upper portion of the pixel defining film PDL. In an embodiment, the opening OH of the pixel defining film PDL may define the emission areas PXA-R, PXA-G and PXA-B. For example, the pixel defining film PDL may include a plurality of openings defining the emission areas PXA-R, PXA-G, and PXA-B, respectively. In an embodiment, a size of an opening at the bottom thereof may define a size of a corresponding emission area among the emission areas PXA-R, PXA-G and PXA-B. However, an embodiment is not limited thereto, and the hole transport region HTR may be patterned to be disposed in the opening OH.

The light-emitting layer EML is provided on the hole transport region HTR. The light-emitting layer EML may include or may be a single layer made of a single material, or a single layer made of a plurality of different materials, or may have a multilayer structure having a plurality of layers made of a plurality of different materials.

The light-emitting layer EML may be made of, for example, a material that emits red, green or blue light, and may include a fluorescent material or a phosphorescent material, and the material is not particularly limited as long as being typically used. For example, the light-emitting layer EML may be disposed in the opening OH defined in the pixel defining film PDL, but an embodiment is not limited thereto. When the display panel DP is an organic electroluminescence display panel, the light-emitting layer EML may include a host and a dopant.

An encapsulation layer TFE may be disposed on the light-emitting element ED, and the encapsulation layer TFE may be disposed on the second electrode EL2. The encapsulation layer TFE may be disposed directly on the second electrode EL2. The same description of the encapsulation layer TFE according to an embodiment described with reference to FIGS. 4 and 5 may be applied to the encapsulation layer TFE.

Figure 8A:
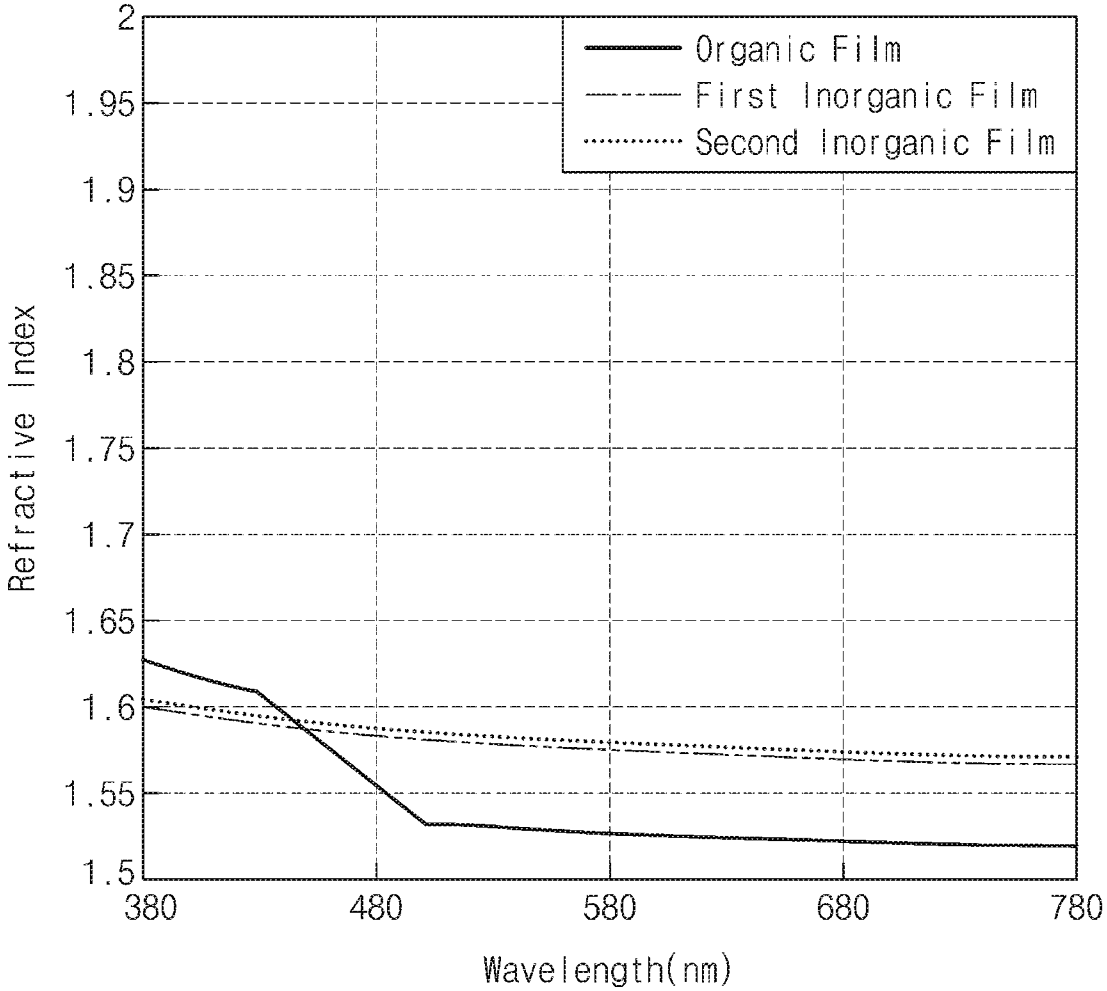
FIG. 8A illustrates a refractive index depending on a wavelength for each of an organic film, a first inorganic film and a second inorganic film of an encapsulation layer according to an Embodiment.
Figure 8B:
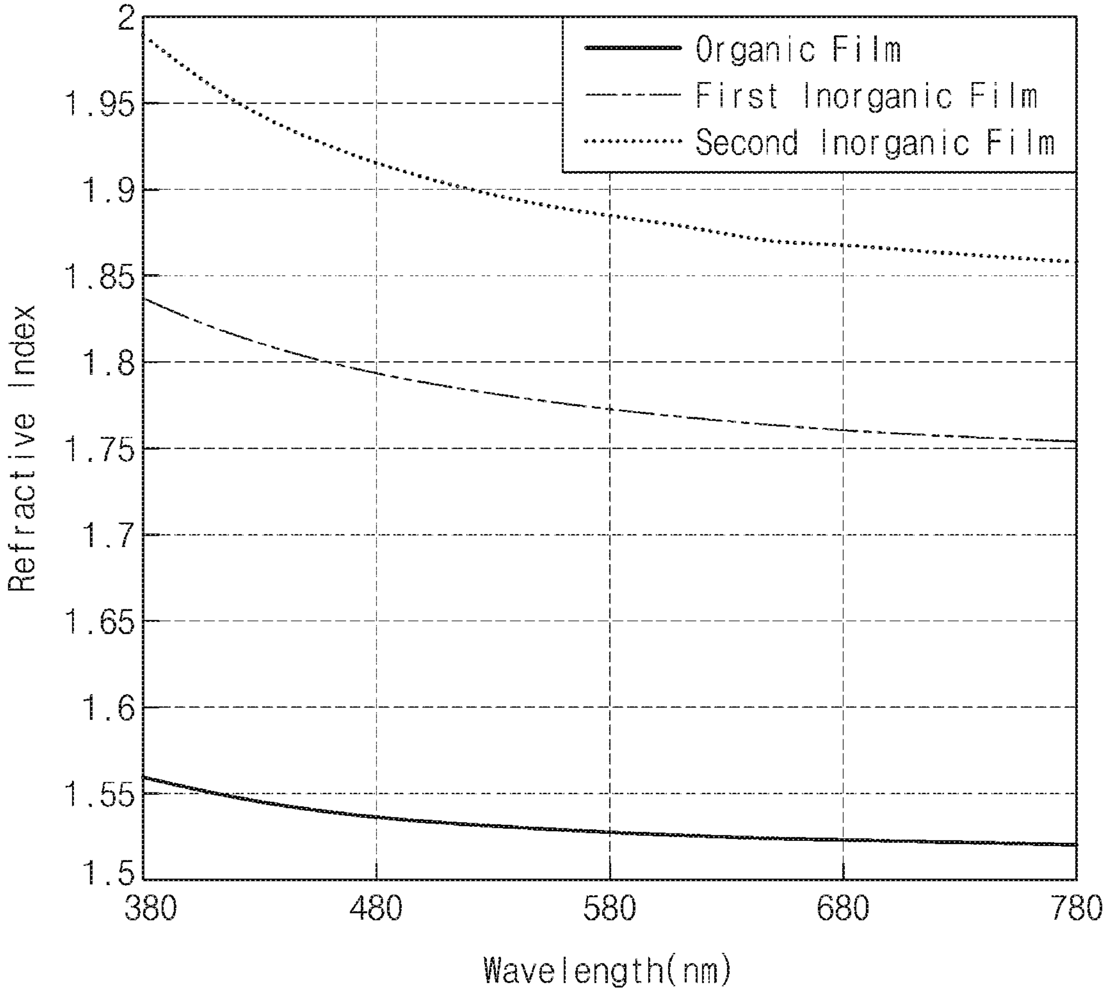
FIG. 8B illustrates a refractive index depending on a wavelength for each of an organic film, a first inorganic film and a second inorganic film of an encapsulation layer according to Comparative Example.
Figure 9:
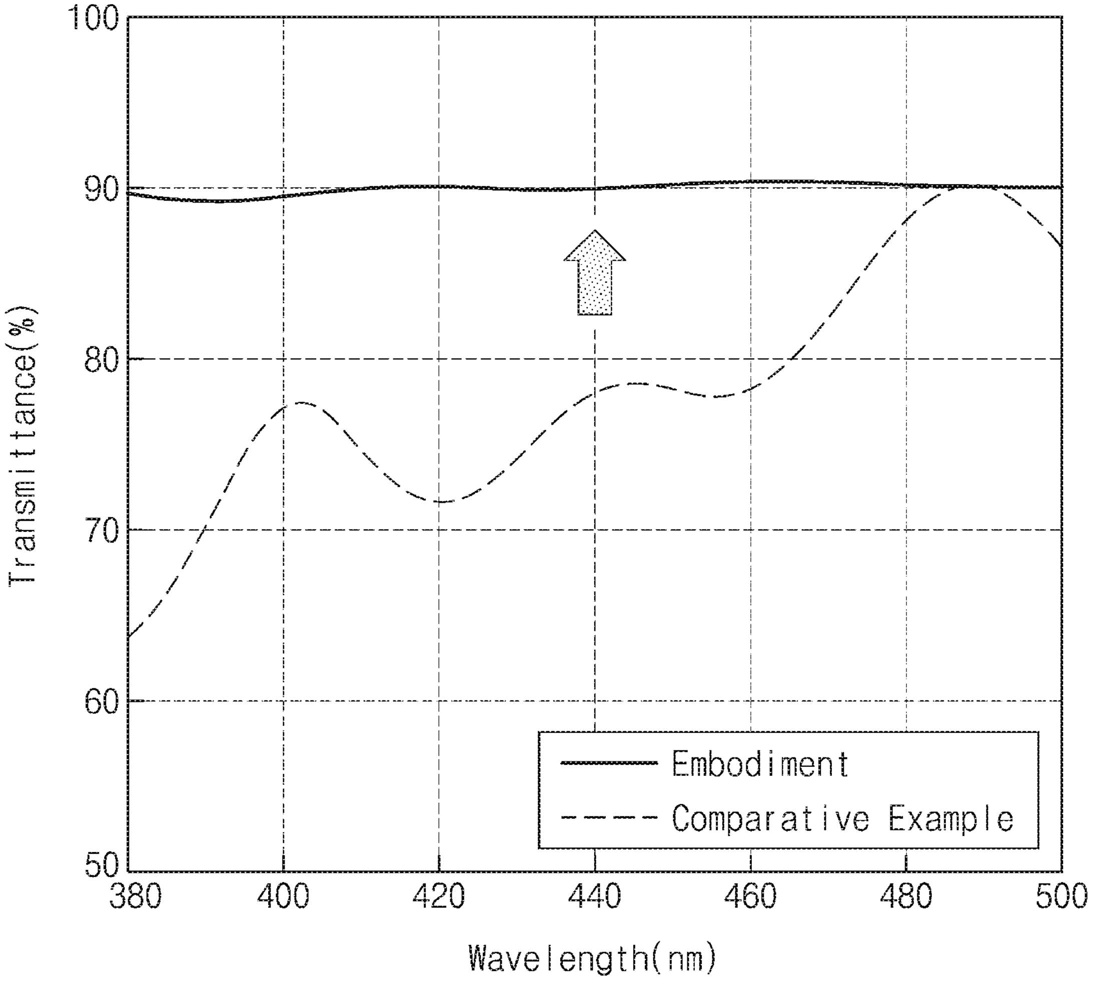
FIG. 9 illustrates a refractive index depending on a wavelength for each of an encapsulation layer according to Embodiment and an encapsulation layer according to Comparative Example.
Figure 10:
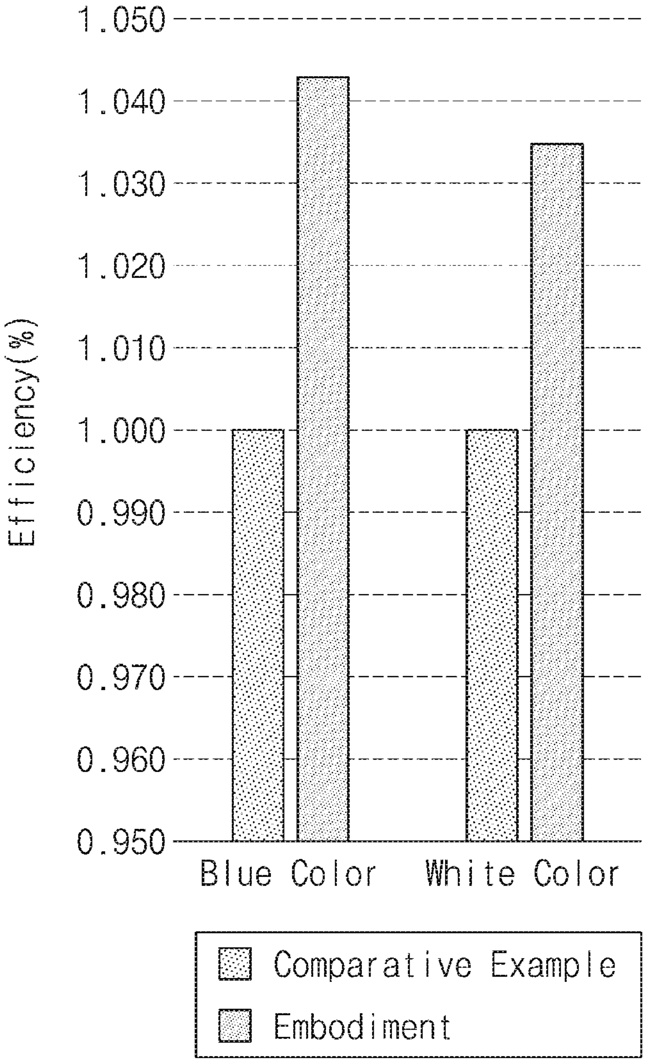
FIG. 10 illustrates the light emission efficiency of each of a display device according to Embodiment and a display device according to Comparative Example.

FIG. 8A illustrates a refractive index depending on a wavelength for each of an organic film, a first inorganic film and a second inorganic film of an encapsulation layer according to Embodiment. FIG. 8B illustrates a refractive index depending on a wavelength for each of an organic film, a first inorganic film and a second inorganic film of an encapsulation layer according to Comparative Example. FIG. 9 illustrates a refractive index depending on a wavelength for each an encapsulation layer according to Embodiment and an encapsulation layer according to Comparative Example. FIG. 10 illustrates the light emission efficiency of each of a display device according to Embodiment and a display device according to Comparative Example. The organic film included in the encapsulation layer according to Embodiment includes or is formed of a copolymer derived from a unit 1 in which a hydroxy ketone group is substituted.

1

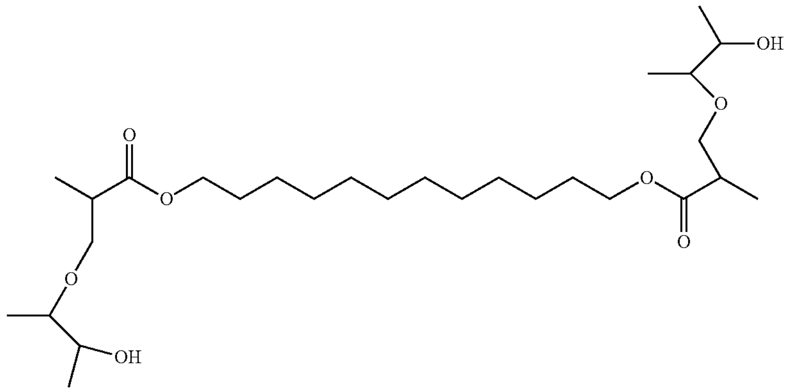

The organic film included in the encapsulation layer according to Comparative Example includes a copolymer derived from a unit X1 in which a phenyl ester group is substituted.

X1

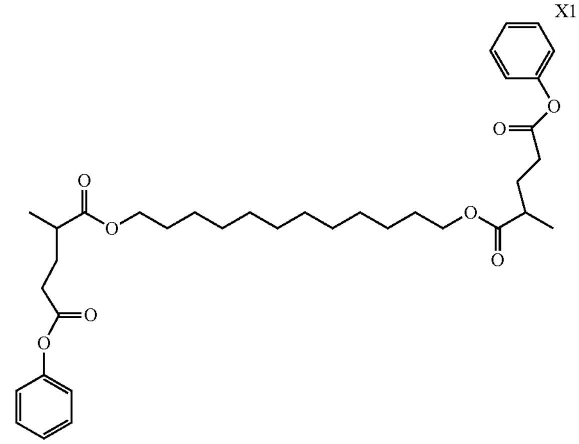 [SMILES: CC(CCC(=O)Oc1ccccc1)C(=O)OCCCCCCCCCCCCOC(=O)C(C)CCC(=O)Oc1ccccc1]

Referring to FIG. 8A, the organic film, the first inorganic film and the second inorganic film, included in the encapsulation layer according to Embodiment, each have a refractive index between about 1.5 and about 1.7 at a wavelength between about 380 nm and about 500 nm, and the refractive index at a wavelength between about 380 nm and about 500 nm is higher than a refractive index at a wavelength between about 500 nm and about 780 nm. Accordingly, an absolute value of a refractive index difference, at a wavelength between about 380 nm and about 500 nm, between the first inorganic film and the organic film is about 0.1 or less, and an absolute value of a refractive index difference between the second inorganic film and the organic film is also about 0.1 or less.

In contrast, referring to FIG. 8B, the organic film included in the encapsulation layer according to Comparative Example has a refractive index between about 1.5 and about 1.6 at a wavelength between about 380 nm and about 500 nm, and the refractive index at a wavelength between about 380 nm and about 500 nm is smaller than that of the organic film according to Embodiment. In addition, the first inorganic film and the second inorganic film, included in the encapsulation layer according to Comparative Example, each have a refractive index of about 1.7 or greater at a wavelength between about 380 nm and about 500 nm. Accordingly, an absolute value of a refractive index difference, at a wavelength between about 380 nm and about 500 nm, between the first inorganic film and the organic film exceeds about 0.1, and an absolute value of a refractive index difference between the second inorganic film and the organic film also exceeds about 0.1.

Referring to FIGS. 8A and 8B, the organic film included in the encapsulation layer according to Embodiment has a higher refractive index at a wavelength between about 380 nm and about 500 nm, compared to the organic film included in the encapsulation layer according to Comparative Example. Considering that the organic film included in the encapsulation layer according to Embodiment includes or is formed of a copolymer derived from the unit 1, and the organic film included in the encapsulation layer according to Comparative Example includes or is formed of a copolymer derived from the unit X1, the type of the substituent included in the copolymer may adjust the refractive index at a wavelength between about 380 nm and about 500 nm. In particular, when the copolymer includes a hydroxy ketone group as a substituent, the refractive index at a wavelength between about 380 nm and about 500 nm is higher, compared to when the copolymer includes a phenyl ester group as a substituent.

Referring to FIG. 9, the encapsulation layer according to Embodiment has an average transmittance of about 90% with respect to light having a wavelength between about 380 nm and about 500 nm. In contrast, the encapsulation layer according to Comparative Example has an average transmittance of about 78% with respect to light having a wavelength between about 380 nm and about 500 nm. Referring to FIGS. 8A to 9, the encapsulation layer according to Embodiment, unlike the encapsulation layer according to Comparative Example, has a small refractive index difference, at a wavelength between about 380 nm and about 500 nm, between the adjacent inorganic film and organic film, and accordingly, and has a transmittance of about 90% or higher with respect to light having a wavelength between about 380 nm and about 500 nm.

Referring to FIG. 10, a display device including the encapsulation layer according to Embodiment exhibits the higher light emission efficiency in each of blue and white colors, compared to a display device according to Comparative Example including the encapsulation layer of Comparative Example.

Referring to FIGS. 9 and 10, the encapsulation layer according to Embodiment has a higher average transmittance with respect to light having a wavelength between about 380 nm and about 500 nm, compared to the encapsulation layer of Comparative Example. Accordingly, the display device including the encapsulation layer according to Embodiment exhibits the higher light emission efficiency in each of blue and white colors, compared to the display device according to Comparative Example including the encapsulation layer according to Comparative Example. The display device according to Embodiment includes the encapsulation layer with the high average transmittance with respect to light having a wavelength between about 380 nm and about 500 nm, thereby having the high light emission efficiency with respect to blue light and accordingly having the high light emission efficiency with respect to white light.

An encapsulation layer included in a display device according to an embodiment includes an inorganic film and an organic film adjacent to each other, and an absolute value of a refractive index difference at a wavelength between about 380 nm and about 500 nm between the inorganic film and the organic film adjacent to each other, is about 0.1 or less. Accordingly, the interfacial reflection may be reduced on an interfacial surface between the organic film and the inorganic film adjacent to each other, and the encapsulation layer may have a high transmittance with respect to light having a wavelength between about 380 nm and about 500 nm. The display device according to an embodiment may include the encapsulation layer having the high transmittance with respect to light having a wavelength between about 380 nm and about 500 nm, thereby improving the emission efficiency of blue light.

An embodiment may provide a display device including an encapsulation layer with the transmittance improved by minimizing a refractive index difference between organic and inorganic films included in the encapsulation layer. An embodiment may include the encapsulation layer with the improved transmittance, thereby providing the display device with the improved light emission efficiency.

Although the embodiments of the present invention have been described, it is understood that the present invention should not be limited to these embodiments but various changes and modifications can be made by one ordinary skilled in the art within the spirit and scope of the present invention as hereinafter claimed.

Therefore, the technical scope of the inventive concept is not limited to the contents described in the detailed description of the specification, but should be determined by the claims.

What is claimed is:

1. A display device comprising:
a light-emitting element layer; and
an encapsulation layer disposed on the light-emitting element layer,
wherein the encapsulation layer comprises:
a first inorganic film having a first refractive index at a wavelength between about 380 nm and about 500 nm, wherein the first refractive index is between about 1.5 and about 1.7;
a second inorganic film disposed on the first inorganic film and having a second refractive index at a wavelength between about 380 nm and about 500 nm,, wherein the second refractive index is between about 1.5 and about 1.7; and
an organic film disposed between the first inorganic film and the second inorganic film, and having a third refractive index at a wavelength between about 380 nm and about 500 nm, wherein the third refractive index is between about 1.5 and about 1.7,
wherein an absolute value of a difference in refractive index between the organic film and the first inorganic film at a wavelength between about 380 nm and about 500 nm is less than or equal to an absolute value of a difference between the third refractive index and the first refractive index at wavelength between about 500 nm and about 780 nm, and an absolute value of a difference in refractive index between the organic film and the second inorganic film at a wavelength between about 380 nm and about 500 nm is less than or equal to an absolute value of a difference in refractive index between the organic film and the second inorganic film at a wavelength between about 500 nm and about 780 nm.

2. The display device of claim 1,
wherein an absolute value of a difference between the second refractive index and the third refractive index is about 0.1 or less, and
wherein an absolute value of a difference between the first refractive index and the third refractive index is about 0.1 or less.

3. The display device of claim 1,
wherein the organic film comprises an epoxy-based copolymer comprising, as a substituent, at least one of a hydroxy ketone group, a carboxyl group, a thioether group, a sulfone group, a cyclic thiophene group, a thiadiazole group, and a thianthrene group.

4. The display device of claim 1,
wherein the first inorganic film has a thickness of about 0.8 μm to about 1.2 μm,
wherein the second inorganic film has a thickness of about 0.5 μm to about 0.7 μm, and
wherein the organic film has a thickness of about 4.0 μm to about 8.0 μm.

5. The display device of claim 1,
wherein the encapsulation layer has a transmittance between about 85% and about 95% with respect to light having a wavelength between about 380 nm and about 500 nm.

6. The display device of claim 1,
wherein each of the first inorganic film, the second inorganic film and the organic film has a refractive index at a wavelength between about 380 nm and about 500 nm that is higher than a refractive index at a wavelength between about 500 nm and about 780 nm.

7. The display device of claim 1,
wherein the light-emitting layer comprises a pixel defining film exposing each of first to third light-emitting elements, and
wherein the first light-emitting element emits red light, the second light-emitting element emits green light, and the third light-emitting element emits blue light.

8. A display device comprising:
a base layer;
a light-emitting element layer disposed on the base layer; and
an encapsulation layer disposed on the light-emitting element layer and comprising at least one inorganic film and at least one organic film, which are alternately laminated,
wherein the at least one organic film comprises an epoxy-based copolymer containing at least one substituent among a hydroxy ketone group, a carboxyl group, a thioether group, a sulfone group, a cyclic thiophene group, a thiadiazole group, and thianthrene group, and
wherein the at least one organic film has a refractive index between about 1.5 and about 1.7 at a wavelength between about 380 nm and about 500 nm,
wherein an absolute value of a difference in refractive index between the at least one organic film and the at least one inorganic film at a wavelength between about 380 nm and about 500 nm is less than or equal to an absolute value of a difference in refractive index between the at least one organic film and the at least one inorganic film at a wavelength between about 500 nm and about 780 nm.

9. The display device of claim 8,
wherein the encapsulation layer has an average transmittance between about 85% and about 95% with respect to light having a wavelength between about 380 nm and about 500 nm.

10. The display device of claim 8,
wherein an absolute value of a refractive index difference between the at least one organic film and the at least one inorganic film that are adjacent to each other, is about 0.1 or less.

11. The display device of claim 8,
wherein the at least one inorganic film includes at least one of $SiN_x$, $SiO_x$, $SiO_xN_y$, SiC, $ZrO_x$, and $Al_2O_3$.

12. The display device of claim 8,
wherein the at least one inorganic film has a thickness smaller than a thickness of the at least one organic film.

13. The display device of claim 12,
wherein the at least one organic film has a thickness between about 4.0 μm and about 8.0 μm.

14. The display device of claim 8,
wherein the light-emitting element layer comprises a pixel defining film exposing each of first to third light-emitting elements, and wherein the first light-emitting element emits red light, the second light-emitting element emits green light, and the third light-emitting element emits blue light.

15. An electronic device comprising a display device, the display device being divided into a first emission area, a second emission area and a third emission area, the display device comprising:

a base layer;

a light-emitting element layer disposed on the base layer and comprising first to third light-emitting elements respectively corresponding to the first to third emission areas; and an encapsulation layer disposed on the light-emitting element layer, and comprising a first inorganic film, a second inorganic film, and an organic film between the first inorganic film and the second inorganic film, wherein the first light-emitting element emits red light, the second light-emitting element emits green light, and the third light-emitting element emits blue light, wherein a planar area of the third emission area is greater than a planar area of each of the first emission area and the second emission area, wherein a first refractive index of the first inorganic film with respect to the blue light is between about 1.5 and about 1.7, wherein a second refractive index of the organic film with respect to the blue light is between about 1.5 and about 1.7, and wherein a third refractive index of the second inorganic film with respect to the blue light is between about 1.5 and about 1.7, wherein an absolute value of a difference in refractive index between the organic film and the first inorganic film wavelength between about 380 nm and about 500 nm is less than or equal to an absolute value of a difference in refractive index between the organic film and the first inorganic film at a wavelength between about 500 nm and about 780 nm, and an absolute value of a difference in refractive index between the organic film and the second inorganic film at a wavelength between about 380 nm and about 500 nm is less than or equal to an absolute value of a difference in refractive index between the organic film and the second inorganic film at a wavelength between about 500 nm and about 780 nm.

16. The electronic device of claim 15, wherein the encapsulation layer has an average transmittance between about 85% and about 95% with respect to the blue light.

17. The electronic device of claim 15, wherein an absolute value of a difference between the first refractive index and the third refractive index is about 0.1 or less, and wherein an absolute value of a difference between the second refractive index and the third refractive index is about 0.1 or less.

18. The electronic device of claim 15, wherein the organic film comprises an epoxy-based copolymer including, as a substituent, at least one of a hydroxy ketone group, a carboxyl group, a thioether group, a sulfone group, a cyclic thiophene group, a thiadiazole group, and a thianthrene group.

19. The electronic device of claim 15, wherein each of the first inorganic film, the second inorganic film and the organic film has a refractive index at a wavelength between about 380 nm and about 500 nm that is higher than a refractive index at a wavelength between about 500 nm and about 780 nm.

20. The electronic device of claim 15, wherein the second emission arca is smaller than the third emission area.

* * * * *